(12) United States Patent
Hall

(10) Patent No.: US 8,037,644 B2
(45) Date of Patent: Oct. 18, 2011

(54) FIRE-CODE-COMPATIBLE, COLLAPSIBLE PARTITIONS TO PREVENT UNWANTED AIRFLOW BETWEEN COMPUTER-ROOM COLD AISLES AND HOT AISLES

(75) Inventor: Shawn A. Hall, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 955 days.

(21) Appl. No.: 11/969,999

(22) Filed: Jan. 7, 2008

(65) Prior Publication Data

US 2009/0173017 A1   Jul. 9, 2009

(51) Int. Cl.
*E04B 1/346* (2006.01)
*E04B 7/16* (2006.01)

(52) U.S. Cl. ............. 52/69; 52/64; 52/65; 52/68; 52/71; 52/1; 52/243.1

(58) Field of Classification Search ................. 52/64, 69, 52/65, 68, 71, 1, 243.1; 160/6, 9, 160, 210
See application file for complete search history.

(56) References Cited

U.S. PATENT DOCUMENTS

| | | | | |
|---|---|---|---|---|
| 3,339,044 A * | 8/1967 | Ruckriegel et al. | ........... | 337/347 |
| 3,830,288 A * | 8/1974 | Laing | ............. | 165/275 |
| 4,662,289 A * | 5/1987 | Harder | ........... | 109/49.5 |
| 5,107,916 A * | 4/1992 | van Roermund et al. | ......... | 160/6 |
| 5,761,854 A * | 6/1998 | Johnson et al. | .................. | 52/69 |
| 6,034,873 A * | 3/2000 | St.ang.hl et al. | ............... | 361/701 |
| 6,223,479 B1 * | 5/2001 | Stockli | .............. | 52/68 |
| 6,305,180 B1 * | 10/2001 | Miller et al. | ................. | 62/259.2 |
| 6,374,627 B1 * | 4/2002 | Schumacher et al. | ........ | 62/259.2 |
| 6,494,050 B2 * | 12/2002 | Spinazzola et al. | ............... | 62/89 |
| 6,672,955 B2 * | 1/2004 | Charron | ........................ | 454/184 |
| 6,819,563 B1 * | 11/2004 | Chu et al. | ..................... | 361/696 |
| 7,259,963 B2 * | 8/2007 | Germagian et al. | .......... | 361/695 |
| 7,315,448 B1 * | 1/2008 | Bash et al. | .................... | 361/701 |
| 7,403,391 B2 * | 7/2008 | Germagian et al. | .......... | 361/695 |
| 7,477,514 B2 * | 1/2009 | Campbell et al. | .............. | 361/699 |
| 7,534,167 B2 * | 5/2009 | Day | ............................. | 454/187 |
| 7,647,787 B2 * | 1/2010 | Belady et al. | ................. | 62/259.2 |
| 7,724,518 B1 * | 5/2010 | Carlson et al. | ........... | 361/679.53 |
| 7,841,199 B2 * | 11/2010 | VanGilder et al. | ........... | 62/259.2 |
| 7,864,527 B1 * | 1/2011 | Whitted | ........................ | 361/696 |
| 2001/0029163 A1 * | 10/2001 | Spinazzola et al. | ........... | 454/184 |
| 2004/0221604 A1 * | 11/2004 | Ota et al. | ..................... | 62/259.2 |
| 2005/0225936 A1 * | 10/2005 | Day | ............................ | 361/687 |
| 2005/0235671 A1 * | 10/2005 | Belady et al. | ................. | 62/259.2 |
| 2006/0038029 A1 * | 2/2006 | Rummig et al. | ................ | 239/71 |

(Continued)

*Primary Examiner* — Eileen D Lillis
*Assistant Examiner* — Mark Wendell
(74) *Attorney, Agent, or Firm* — Scully, Scott, Murphy & Presser, P.C.; Daniel P. Morris, Esq.

(57) ABSTRACT

An arrangement for the cooling of computer data centers. More particularly, the arrangement eliminates the problems present in the uneven or inadequate cooling of computer racks due to unwanted airflows, which are encountered between so-called hot aisles and cold aisles present in a computer data center. Specifically, this problem is solved through the provision of partitions which, under normal circumstances, prevent the unwanted airflows by standing in a vertical orientation, yet which, in the event of a fire, collapse from the vertical orientation to a horizontal orientation, thereby avoiding interference with water sprays from sprinkler heads, and thus complying with fire codes and ordinances. Moreover, also employed is a method of preventing the unwanted air flows by utilization of the novel arrangement comprising the fire-code-compatible, collapsible partitions.

20 Claims, 8 Drawing Sheets

U.S. PATENT DOCUMENTS

| | | | |
|---|---|---|---|
| 2006/0102322 A1* | 5/2006 | Madara et al. | 165/104.21 |
| 2006/0250770 A1* | 11/2006 | Campbell et al. | 361/695 |
| 2006/0260338 A1* | 11/2006 | VanGilder et al. | 62/259.2 |
| 2007/0019380 A1* | 1/2007 | Campbell et al. | 361/687 |
| 2010/0139908 A1* | 6/2010 | Slessman | 165/279 |
| 2010/0248609 A1* | 9/2010 | Tresh et al. | 454/184 |

* cited by examiner

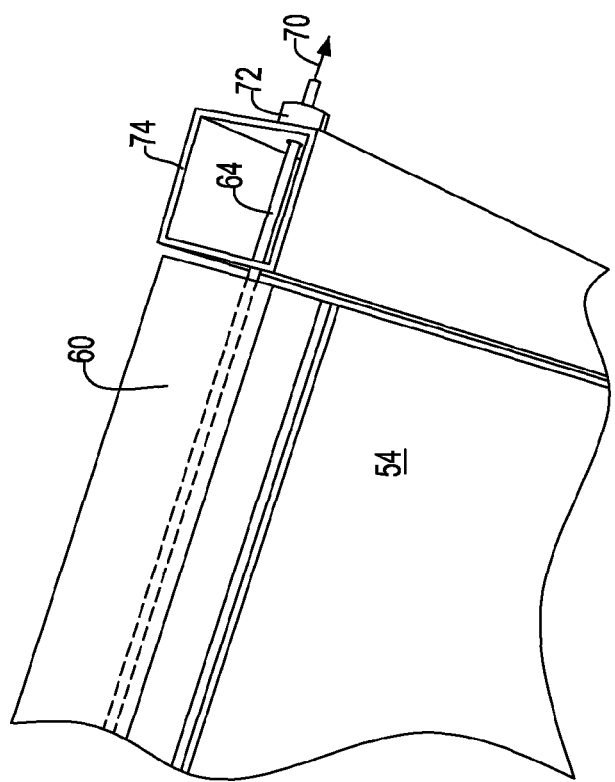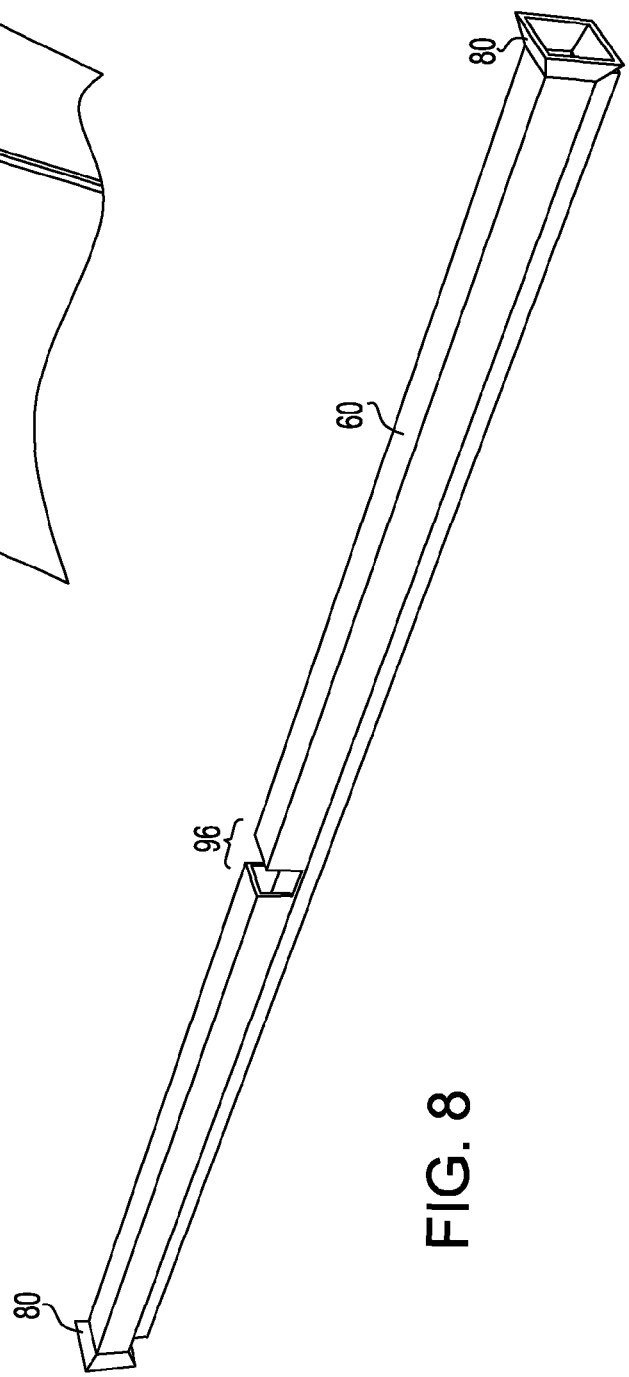

FIRE-CODE-COMPATIBLE, COLLAPSIBLE PARTITIONS TO PREVENT UNWANTED AIRFLOW BETWEEN COMPUTER-ROOM COLD AISLES AND HOT AISLES

BACKGROUND OF THE INVENTION

1. Field of the Invention

The present invention relates to an arrangement for the cooling of computer data centers. More particularly, the invention relates to an arrangement that eliminates the problems present in the uneven or inadequate cooling of computer racks due to unwanted airflows, which are encountered between so-called hot aisles and cold aisles present in a computer data center. Specifically, this problem is solved through the provision of partitions which, under normal circumstances, prevent the unwanted airflows by standing in a vertical orientation, yet which, in the event of a fire, collapse from the vertical orientation to a horizontal orientation, thereby avoiding interference with water sprays from sprinkler heads, and thus complying with fire codes and ordinances. Moreover, also employed is a method of preventing the unwanted air flows by utilization of the novel arrangement comprising the fire-code-compatible, collapsible partitions.

2. Discussion of the Prior Art

In the current state of the art, computer data centers frequently contain a plurality of computer racks arranged in rows with aisles therebetween. The racks in any one of the rows are typically cooled by forced convection of air that flows from one of the two aisles adjacent to the row (called the cold aisle) to the other adjacent aisle (the hot aisle). To obtain alternating cold aisles and hot aisles, airflow in every other row is oppositely directed, so that any two adjacent rows either draw cold air from a common cold aisle, or exhaust hot air to a common hot aisle. A problem with this arrangement is that unwanted airflows may occur, over the tops of the rows, from the hot aisles, where air is at a relatively high temperature and pressure, to the cold aisles, where air is at a relatively low temperature and pressure. Such unwanted flows cause the cold aisles to be contaminated with hot air, which may be drawn into the computer racks, thus compromising cooling of electronics components therein.

In the prior art, to alleviate the foregoing problem, permanent vertical partitions have been erected above the rows to prevent the unwanted airflows. However, such permanent structures generally violate fire-code requirements or ordinances which stipulate that, during a fire, the gap between the top of the racks and the ceiling must be unencumbered, so as to avoid interference with spray patterns of water emanating from sprinkler heads located near the ceiling.

SUMMARY OF THE INVENTION

Accordingly, to obviate violations of fire code associated with encumbrances in the space between the top of the computer racks and the ceiling the present invention provides partitions that, in the event of fire, automatically collapse prior to activation of the sprinkler heads. During normal operation of the data center, the inventive collapsible partitions are in their un-collapsed state and thus prevent unwanted airflows. During a fire, the partitions collapse to avoid interfering with the sprinkler system, thus complying with fire-code requirements.

Accordingly, it is an object of the present invention to provide a novel partition structure of a collapsible nature that inhibits unwanted air flows during normal operation of a computer data center, yet does not prevent sprinkler heads from efficiently dispensing quenching water sprays in the event of a fire.

Another object of the invention is to provide a novel method of utilizing partition structures for deployment in computer data centers.

BRIEF DESCRIPTION OF THE DRAWINGS

Reference may now be made to the following detailed description of preferred embodiments of the invention, taken in conjunction with the accompanying drawings; in which:

FIG. 7 illustrates a perspective fragmentary view showing an end of the guy-wire assembly of FIG. 6;

FIG. 8 illustrates a perspective representation of a version of the channel formed on the partition structure.

DETAILED DESCRIPTION OF THE PREFERRED EMBODIMENT

Figure 1:
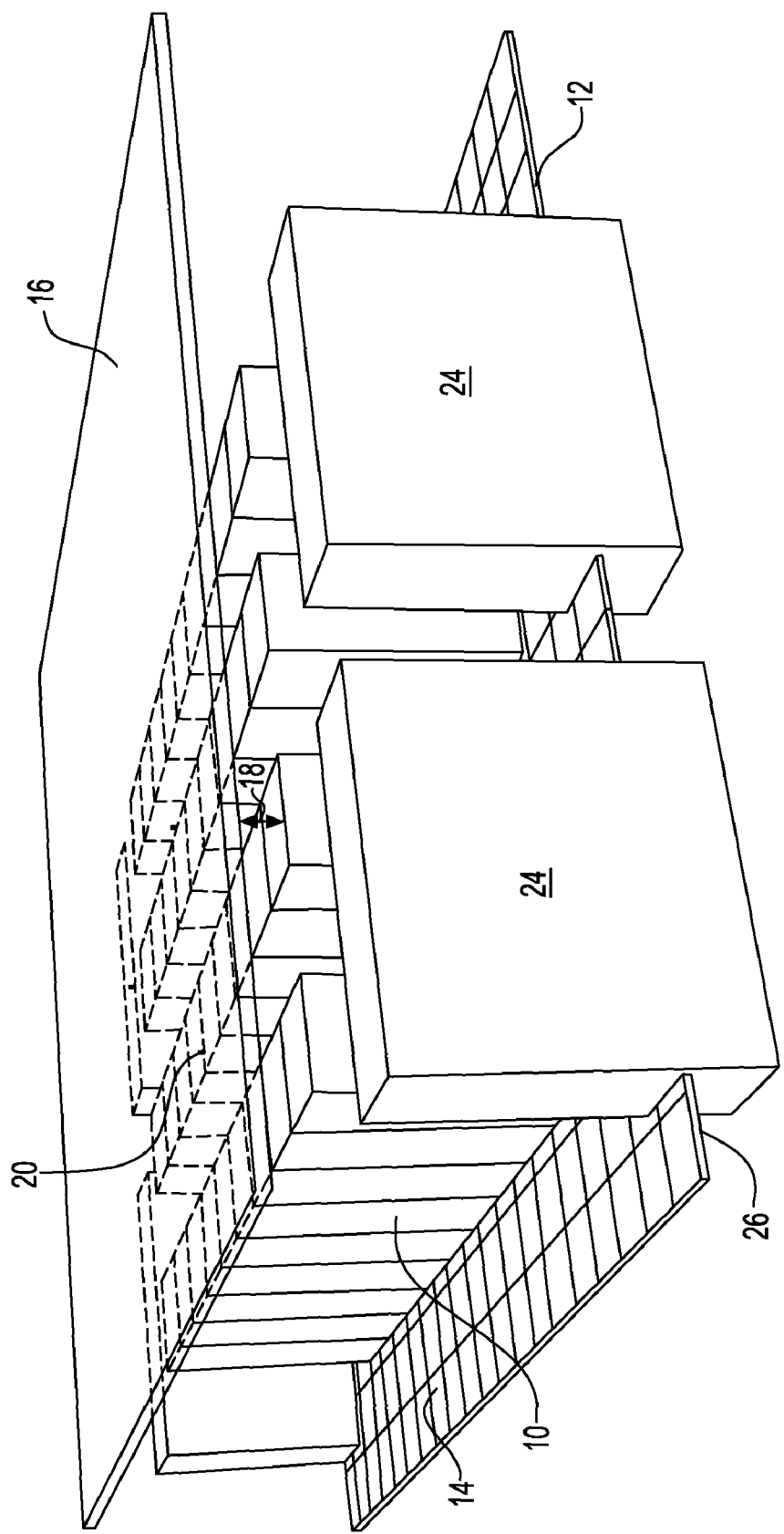
FIG. 1 illustrates generally diagrammatically a three-dimensional perspective view of a typical computer data center constructed in accordance with current art.

Referring to FIG. 1, a state-of-the-art computer data center typically comprises an array of air-cooled equipment racks 10 resting on a raised floor 12 comprised of a regular array of tiles 14. Above the racks 10 is located the ceiling 16. According to fire code requisites, there must be provided a gap 18, typically about 18" in height, between the top of the racks and the ceiling, such that during a fire, a water spray pattern from sprinkler heads 20 located in the ceiling is not blocked by the presence of any encumbrances in the gap 18.

Figure 2:
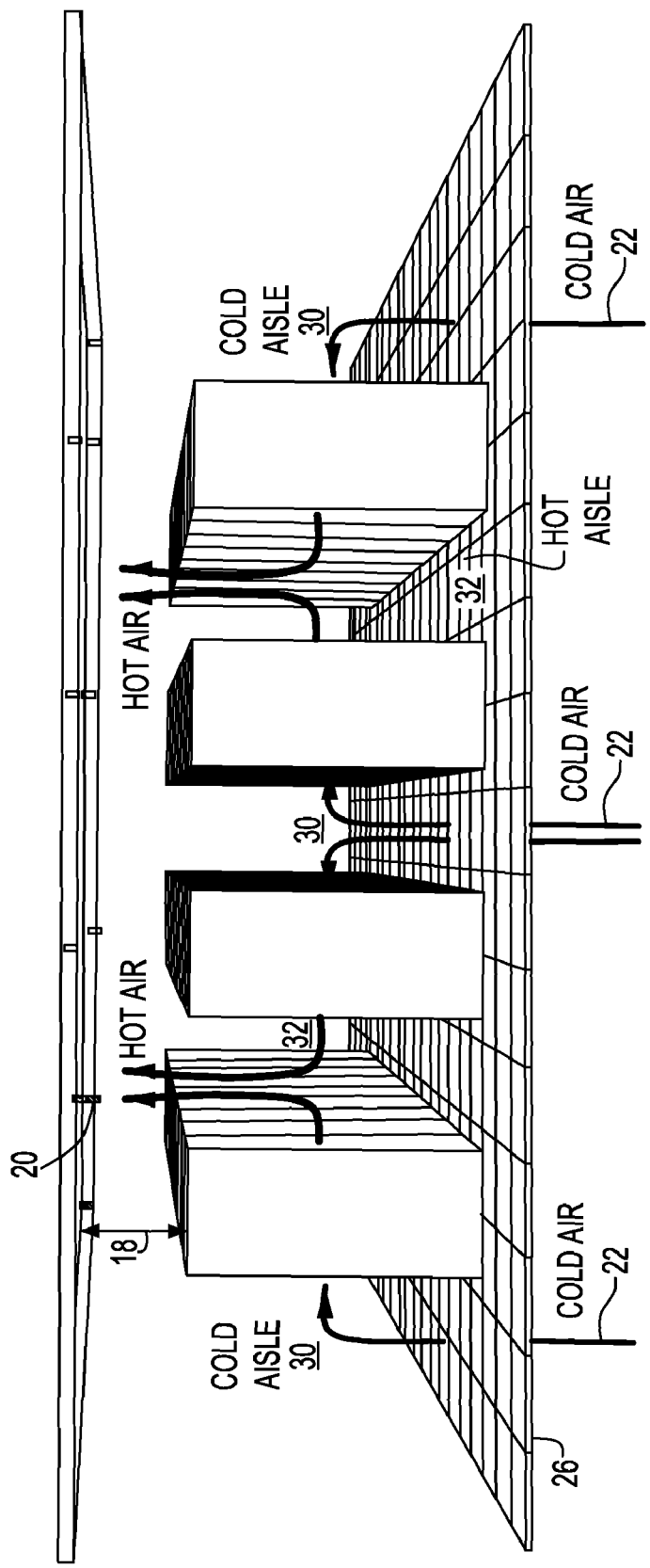
FIG. 2 illustrates a perspective three-dimensional view showing the intended airflow paths that are to be provided in a typical data center, pursuant to the prior art.

The racks 10 are cooled by a flow of cold air 22 that is generated by suitable air-conditioning units 24 in such a manner that the cold air fills a plenum space 26 located below a raised floor 12. Referring to FIG. 2 and the xyz coordinate system thereon, this airflow emerges in the +z direction from the plenum space 26 through perforations provided in raised floor tiles that pave so-called cold aisles 30, which alternate with so-called hot aisles 32 paved by solid, imperforated floor tiles. The intent of this arrangement is that the air should flow through the racks 10 in the +y direction, and then should flow in the +x direction along the hot aisles 32 to the air conditioning units 24 shown in FIG. 1, and which are located at the ends of the aisles.

Figure 3:
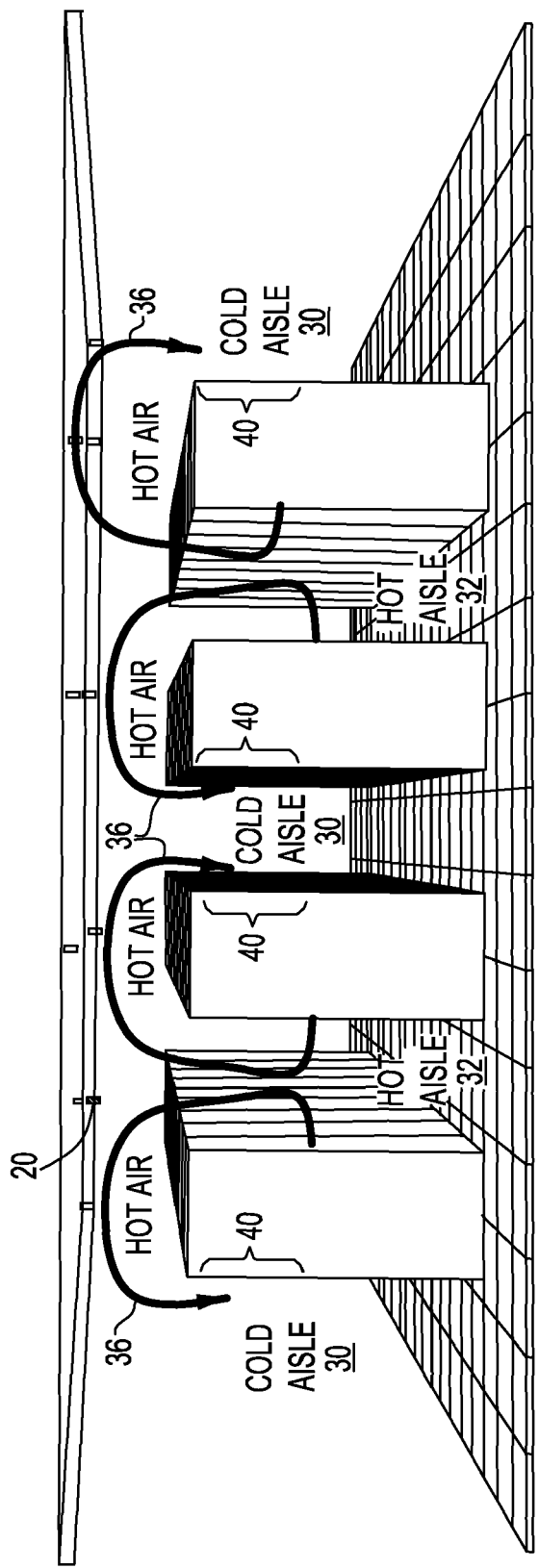
FIG. 3 illustrates a perspective representation showing the undesirable or unwanted airflow paths that are encountered in present computer data centers.

However, because of gap 18, the air does not flow as intended. Instead, as shown in FIG. 3, the air flows through gap 18 in unwanted air circulation patterns 36, thereby creating an aerodynamic short circuit between hot aisles 32 and cold aisles 30. Thus the upper portions 40 of the racks 10 intake hot air rather than cold air, thereby compromising the efficacy of cooling for equipment housed in the upper portions 40 of the racks.

Figure 4:
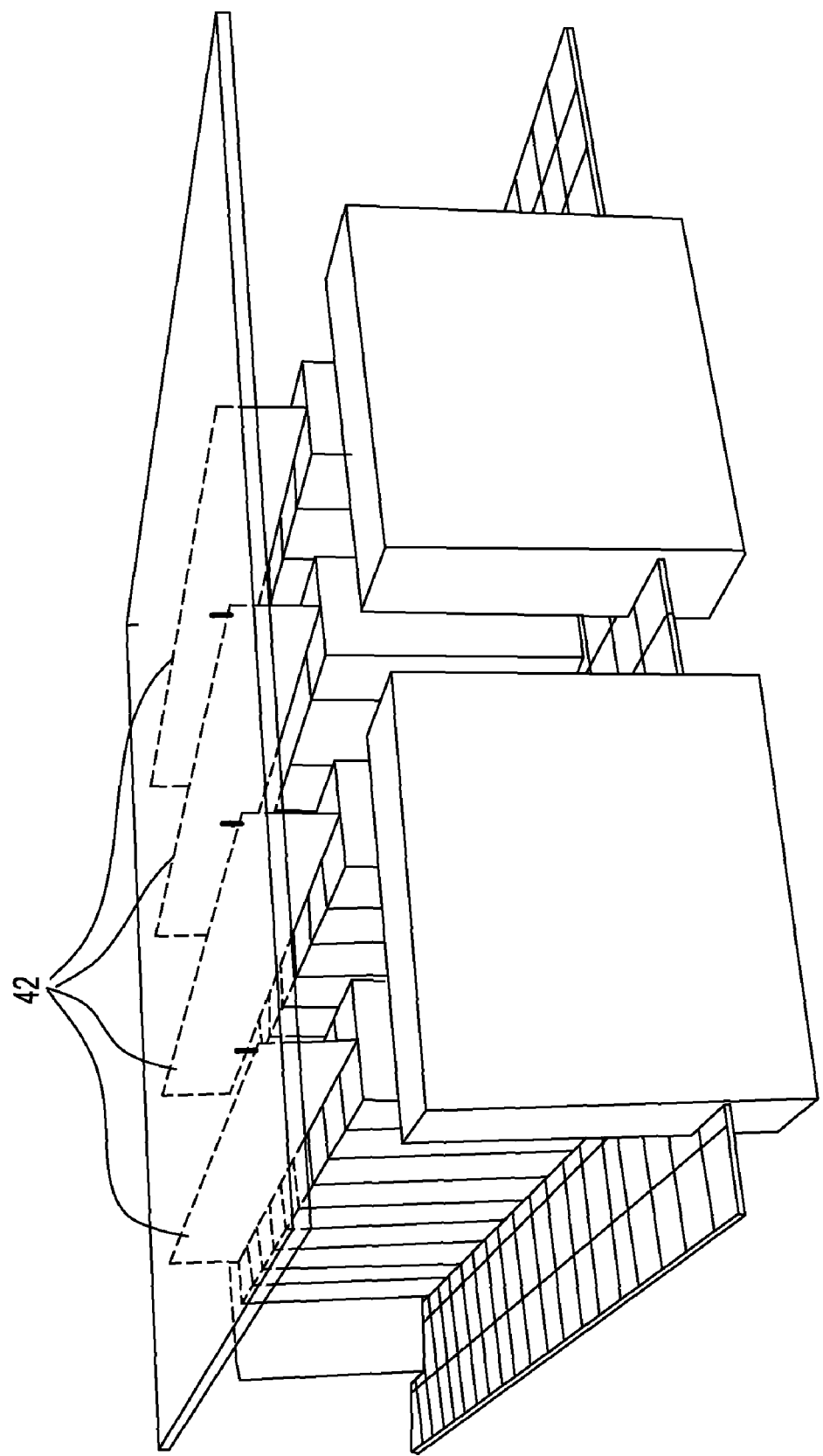
FIG. 4 illustrates a perspective representation of a computer center pursuant to the current technology showing prior-art solutions attempting to prevent unwanted airflow paths circulating through the data center.

Referring to FIG. 4, a prior-art solution to the foregoing problem comprises the installation of permanent vertical partitions 42 that prevent the unwanted air-circulation patterns 36 of FIG. 3. However, this kind of installation violates the aforementioned fire-code ordinances or requirements specifying that during a fire no encumbrances in gap 18 interfere with the water sprays from sprinkler heads 20.

Figure 5:
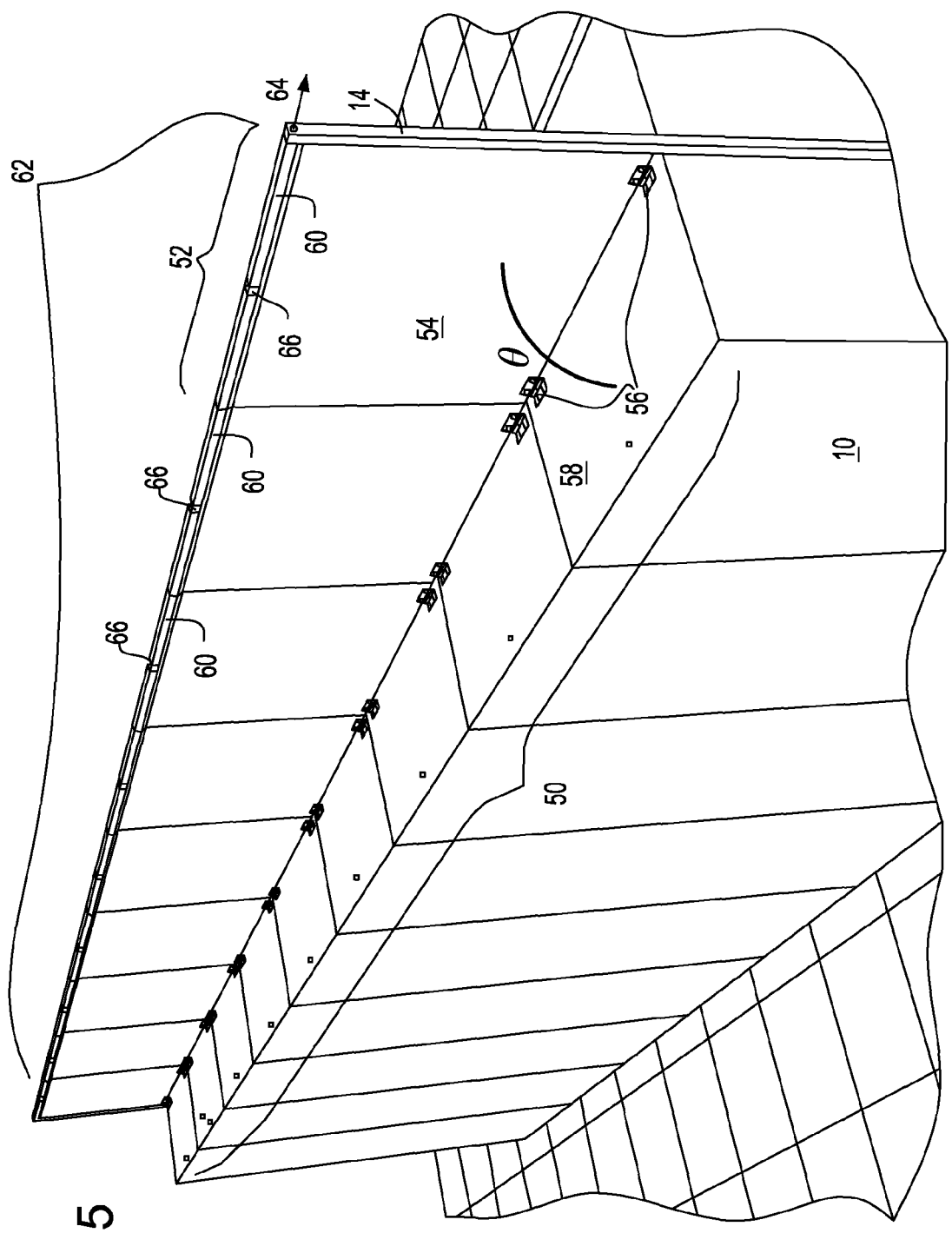
FIG. 5 illustrates a generally diagrammatic perspective view of the invention, as applied to a row of computer racks.
Figure 6:
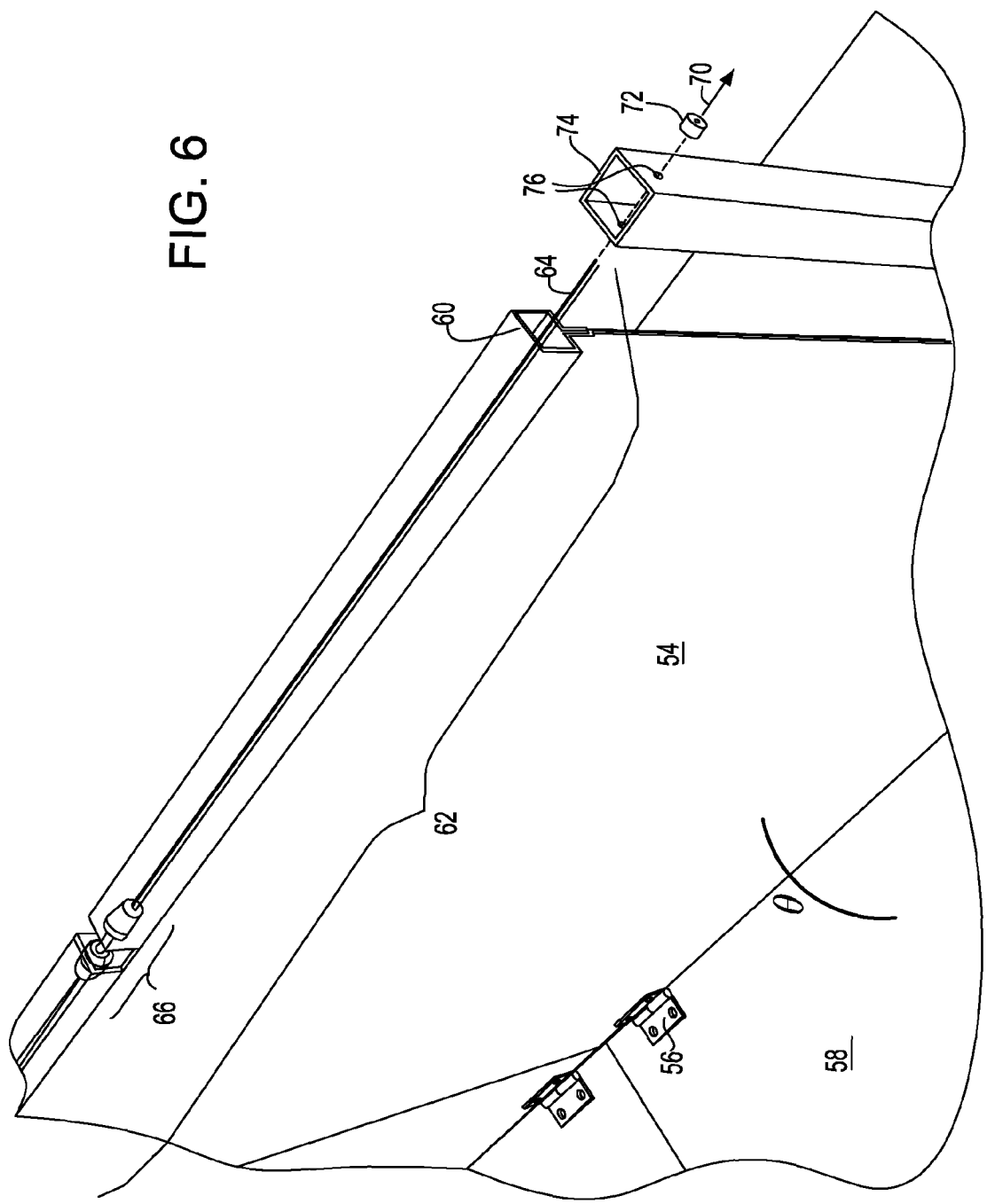
FIG. 6 illustrates a partly exploded three-dimensional, perspective representation showing a guy-wire assembly connected to a partition plate in a channel structure for the plate pursuant to the present invention.

Reverting now specifically to the inventive arrangement of collapsible partitions, reference is made to FIG. 5, as well as the exploded, enlarged FIG. 6, and the detail in FIG. 7. Hereby, the invention solves the encountered problem as described above by replacing the prior-art permanent partitions 42 on top of a rack row 50 by a plurality of tiltable-plate assemblies 52. In the drawings, one tiltable-plate assembly 52 for each rack 10 is shown for illustrative purposes; however, for example, one tiltable-plate assembly 52 can conceivably span two or more racks 10. Each tiltable-plate assembly, constituted entirely of non-flammable materials, comprises a tiltable-plate 54 that is hinged by means of hinges 56 to a base plate 58. Each tiltable plate assembly 52 further comprises a channel 60 (shown translucently for clarity in FIGS. 6 and 7), which is fastened on top of the tiltable plate 54. As shown in FIG. 6, channel 60 is suitable for containing and guiding a guy-wire assembly 62, which consists of a plurality of guy-wire segments 64 and trigger-point assemblies 66. In FIG. 5, one trigger-point assembly 66 for each tiltable plate assembly 52 is shown for convenience, but either more or fewer may be installed, although, in general, there is provided at least one trigger-point assembly 66 and two guy-wire segments 64 per rack row 50.

Referring to FIGS. 6 and 7, under normal operating conditions, each tiltable plate 54 is maintained at or proximate an angular position of θ=90° by tension 70 imparted in the guy-wire segments 64, which stretch from one end of the rack row 50 to the other end through the plurality of channels 60, this tension being maintained by a pair of wire grippers 72 and a pair of vertical struts 74, located one each at either end of the rack row. The two endmost guy-wire segments 64 pass through holes 76 in the two vertical struts 74, one at each end of the rack row 50. The two wire grippers 72, each of which bears against the outer surface of its juxtaposed vertical strut 74, grip the endmost segments 78 of the guy-wire assembly 62, thereby maintaining tension 70 during normal operation.

The trigger-point assembly 66 is designed to split apart when the temperature surrounding it exceeds a specific trigger temperature, as in the event of a fire, thereby releasing the tension 70 in the guy-wire assembly 62, and thereby ensuring that each of the tiltable plates 54 swings down under the action of gravity from an unstable vertical position θ=90° into one of two horizontal positions θ=0° or θ=180°. As the tiltable plates swing or tilt down, the guy-wire assembly 52, now divided into two or more pieces, slides smoothly through the channel 60 without snagging the trigger-point assemblies, inasmuch as this would interfere with the downward tilting of plates 54. If necessary, in order to achieve this, the channel 60 may have flared ends 80, as shown in FIG. 8. When simpler to achieve flaring, the annular cross section of the channel 60 may be round rather than rectangular.

An important aspect of the invention is to ensure that the tiltable plates 54 tilt down well before any sprinkler head 20 sprays water, thereby restoring the unobstructed gap 18 required by the fire-code. Thus, the invention specifies that one or more trigger-point assemblies split apart at a threshold temperature that is lower than the temperature at which a sprinkler head activates, and at a faster response time. Sprinkler heads are commonly triggered either by the melting of solder, or more commonly by the breakage of a glass ampule filled with a glycerin-based liquid that expands when heated. Typical ampules, 5 mm in diameter, are designed to break within one to one-and-a half minutes of exposure to a temperature higher than 155° F. (68° C.), although various ampules are available that break at different temperatures and at faster or slower response time, as required under the circumstances.

Figure 9:
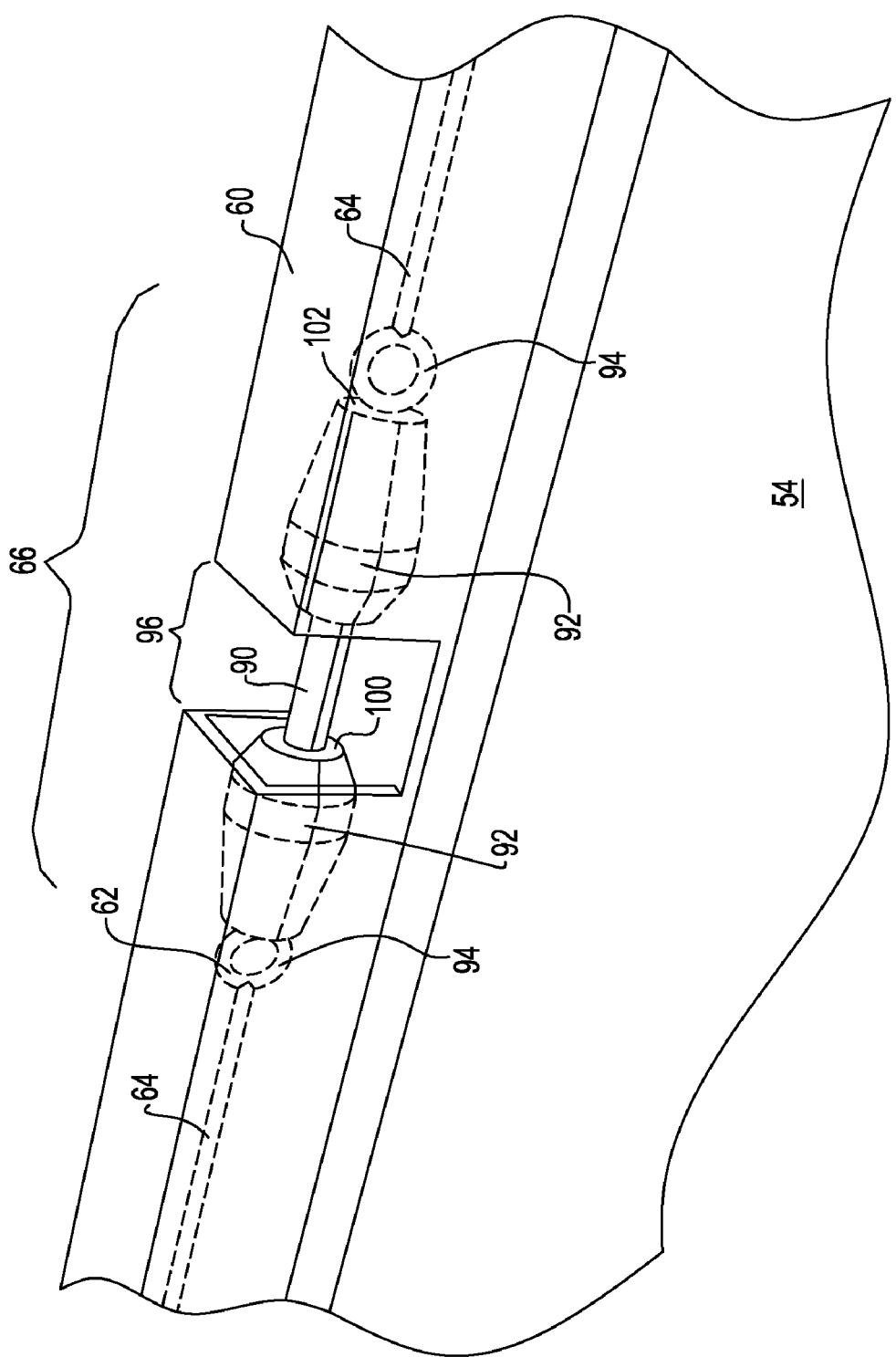
FIG. 9 illustrates a further perspective detailed representation of a trigger-point assembly for actuating the collapsible partition structure in the event of a fire.

Thus, the invention employs the same type of reliable, proven triggering mechanism used by sprinkler heads, but using ampules that break at a somewhat lower trigger temperature and at a faster response time than which is typical for sprinklers, in order to ensure that the tiltable plates tilt down before any sprinkler commences sprinkling. Specifically, referring to FIG. 9, each trigger-point assembly 66 comprises an ampule 90 (of the type described above), which is fixed between two ampule holders 92, each ampule holder including structure 94 for the attachment of a guy-wire segment 64. At each trigger-point assembly 66, the channel 60 is provided with a notch 96 in order to expose the ampule 90 to ambient, (i.e., room) temperature. Each ampule holder 92 is chamfered at both its ampule end 100 and its guy-wire end 102, and the channel 60, ampule holders 92 and notch 96 are sized to ensure that the trigger-point assemblies 66 slide easily down the channel 60, as they must to ensure that the entire array of tiltable plates 54 successfully swing down even when just one ampule 90 breaks. To prevent snagging of the guy-wires, edges of the notch 96 may have flared edges similar to the flared ends 80 previously described in connection with FIG. 8.

The invention thus provides the advantage of multiple trigger points, any one of which will cause the entire row of tiltable plates to swing or tilt down. This is important because frequently, during a fire, heat is generated only locally (i.e. only one or two sprinkler heads in a room may typically trigger), yet the invention succeeds in producing, from such localized heating, a global or overall result, in essence, the collapse or tilting down of the entire row of tiltable plates.

The invention has the additional advantage that the trigger-point assemblies 66 are located near the ceiling 16. This is important because during normal operating conditions, but especially during a fire, the encountered temperature range is stratified from floor to ceiling. Thus, the invention places the trigger-point assemblies 66 in the same temperature stratum as the sprinkler heads 20, thereby assuring similar ambient temperatures for the two devices 66, 20, and, thus, (because the trigger-points are designed to trigger at a lower temperature than the sprinkler heads), minimizing the chance that a sprinkler head will ever trigger before the tilting of nearby tiltable plates 54.

From the foregoing, it becomes readily apparent that the invention eliminates the unwanted air circulation 36 in a way that is compliant with fire codes and ordinances. That is, during normal operation, with tiltable plates 54 in their vertical orientation, the gap 18 between computer racks and ceiling is substantially closed, thereby eliminating unwanted air circulation 36; yet, at the onset of a fire, the gap 18 is re-opened in a very reliable way by collapse of the tiltable plates 54 to their horizontal orientation, thereby removing any impediment to the free spray of water from sprinkler heads 20. Inasmuch as the collapse of tiltable plates 54 is triggered by the same reliable mechanism as the sprinkler heads themselves, and carried out simply by gravity, the reliability of this system is extremely high.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but to fall within the spirit and scope of the appended claims.

What is claimed is:

1. An arrangement for inhibiting an unwanted airflow from hot aisles to cold aisles in a computer-room installation during the cooling of said installation, said arrangement comprising:
    a plurality of partitions preventing said unwanted airflow between said hot and cold aisles in a first position of said partitions during said cooling; and
    an operative mechanism connected respectively to each of said partitions for tilting said at least one partition downwardly into a second position to allow, in the event of a conflagration in said computer-room installation, an unhindered discharge of water from an overhead sprinkler system;
    a plurality of trigger points disposed spaced along said rows of said computer racks, each said trigger point comprises a triggering mechanism facilitating the tilting down of the respective therewith associated partition;
    said computer-room installation comprises computer equipment-containing rows of racks having said hot and cold aisles extending therebetween, said computer-room installation having a ceiling at a spacing above upper ends of said racks for said unhindered discharge of water therethrough, and said first position of said partitions being a substantially vertical orientation on said upper ends of said racks; and
    said operative mechanism is connected respectively to each said partition, said operative mechanism, in the event of a conflagration, effectuating a tilting down of said partitions into said second position, said second position being a substantially horizontal orientation responsive to gravity upon a triggering of at least one said trigger point.

2. An arrangement as claimed in claim 1, wherein said plurality of said partitions are located on said upper ends of said racks in mutually spaced relationships along the path of air flow circulation.

3. An arrangement as claimed in claim 1, wherein each said partition comprises a plate having a lower edge hingedly connected to the upper end of a therewith-associated rack.

4. An arrangement as claimed in claim 1, wherein said trigger points are components of guy-wires connected to said partitions under tension maintaining said partitions in said vertical orientation during cooling operation of said computer-room installation.

5. An arrangement as claimed in claim 4, wherein said trigger points are breakable responsive to sensing a condition of conflagration so as to release the tension of said guy-wires enabling said partitions to tilt downward gravitationally into said horizontal orientation.

6. An arrangement as claimed in claim 1, wherein each said triggering mechanism comprises a glass ampule containing a liquid that is expandable in response to a high temperature caused by a conflagration so as to rupture the ampule and initiate said tilting down of said partitions from said vertical orientation to said horizontal orientation.

7. An arrangement as claimed in claim 1, wherein said trigger points each utilize melting properties of a low-melting temperature to activate release of the guy-wire tensions so as to allow said tilting down of said partitions from said vertical orientation to said horizontal orientation.

8. An arrangement as claimed in claim 1, wherein said trigger points each utilize a shape-memory metal for releasing the guy-wire tension.

9. An arrangement as claimed in claim 1, wherein said trigger points facilitate said tilting down of said partitions prior to the commencement of a water discharge from said sprinkler system.

10. An arrangement as claimed in claim 1, wherein said arrangement is constructed in compliance with a specified fire ordinance or regulation, including municipal and statutory fire ordinances and regulations.

11. A method for inhibiting an unwanted airflow from hot aisles to cold aisles in a computer-room installation during the cooling of said installation, said method comprising:
    providing a plurality of partitions preventing said unwanted air flow between said hot and cold aisles in a first position of said partitions during said cooling; and
    connecting an operative mechanism connected respectively to each of said partitions for tilting said at least one partition downwardly into a second position to allow in the event of a conflagration in said computer-room installation, an unhindered discharge of water from an overhead sprinkler system;
    installing in said computer-room comprises computer equipment-containing rows of racks having said hot and cold aisles extending therebetween, said computer-room installation having a ceiling at a spacing above upper ends of said racks for said unhindered discharge of water therethrough, and said first position of said partitions being a substantially vertical orientation on said upper ends of said racks;
    connecting an operative mechanism respectively to each said partition;
    effectuating a tilting down of said partitions into said second position using said operative mechanism in the event of a conflagration;
    triggering of at least one trigger point of a plurality of trigger points disposed spaced along said rows of said computer racks, said second position being a substantially horizontal orientation responsive to gravity upon said triggering, wherein each said trigger point comprises a triggering mechanism in connection with an associated partition.

12. A method as claimed in claim 11, wherein a plurality of partitions are located on said upper ends of said racks in mutually spaced relationships along the path of air flow circulation.

13. A method as claimed in claim 11, wherein each said partition comprises a plate having a lower edge hingedly connected to the upper end of a therewith-associated rack.

14. A method as claimed in claim 11, wherein said trigger points are components of guy-wires connected to said partitions under tension maintaining said partitions in said vertical orientation during cooling operation of said computer-room installation.

15. A method as claimed in claim 14, wherein said trigger points are breakable responsive to sensing a condition of conflagration so as to release the tension of said guy-wires enabling said partitions to tilt downward gravitationally into said horizontal orientation.

16. A method as claimed in claim 11, wherein each said triggering mechanism comprises a glass ampule containing a liquid that is expandable in response to a high temperature caused by a conflagration so as to rupture the ampule and initiate said tilting down of said partitions from said vertical orientation to said horizontal orientation.

17. A method as claimed in claim 11, wherein said trigger points each utilize melting properties of a low-melting temperature to activate release of the guy-wire tensions so as to allow said tilting down of said partitions from said vertical orientation to said horizontal orientation.

18. A method as claimed in claim 11, wherein said trigger points each utilize a shape-memory metal for releasing the guy-wire tension.

19. A method as claimed in claim 11 wherein said trigger points facilitate said tilting down of said partitions prior to the commencing of a water discharge from said sprinkler system.

20. A method as claimed in claim 11, wherein said method is constructed in compliance with a specified fire ordinance or regulation, including municipal and statutory fire ordinances and regulations.

* * * * *